(12) United States Patent
Camp

(10) Patent No.: US 10,725,192 B2
(45) Date of Patent: Jul. 28, 2020

(54) PASSIVE MAGNETIC FIELD DETECTOR

(71) Applicant: James Thomas Camp, Colonial Beach, VA (US)

(72) Inventor: James Thomas Camp, Colonial Beach, VA (US)

(73) Assignee: United States of America, as represented by the Secretary of the Navy, Arlington, VA (US)

( * ) Notice: Subject to any disclaimer, the term of this patent is extended or adjusted under 35 U.S.C. 154(b) by 58 days.

(21) Appl. No.: 16/155,934

(22) Filed: Oct. 10, 2018

(65) Prior Publication Data

US 2020/0116888 A1 Apr. 16, 2020

(51) Int. Cl.
| | |
|---|---|
| *G01V 3/10* | (2006.01) |
| *G01R 33/02* | (2006.01) |
| *G08B 21/18* | (2006.01) |
| *G08B 3/10* | (2006.01) |
| *G08B 5/36* | (2006.01) |

(52) U.S. Cl.
CPC .............. *G01V 3/10* (2013.01); *G01R 33/02* (2013.01); *G08B 21/182* (2013.01); *G08B 3/10* (2013.01); *G08B 5/36* (2013.01)

(58) Field of Classification Search
CPC .......... G01V 3/10; G08B 21/182; G08B 3/10; G08B 5/36; G01R 33/02
USPC ...................... 324/260, 200, 76.11
See application file for complete search history.

(56) References Cited

U.S. PATENT DOCUMENTS

| | | | | |
|---|---|---|---|---|
| 5,027,709 | A * | 7/1991 | Slagle | F42B 8/28 102/293 |
| 6,617,972 | B2 * | 9/2003 | Takarada | G08B 21/0484 324/538 |
| 7,504,840 | B2 * | 3/2009 | Arat | G01R 1/06733 324/755.05 |
| 7,825,543 | B2 | 11/2010 | Karalis et al. | 307/104 |
| 8,779,729 | B2 * | 7/2014 | Shiraishi | G06F 1/3212 320/155 |
| 2002/0017914 | A1 * | 2/2002 | Roggel | G01R 1/06738 324/754.2 |
| 2006/0022689 | A1 * | 2/2006 | Golden | G01R 1/06783 324/754.04 |
| 2012/0098518 | A1 * | 4/2012 | Unagami | G01R 22/066 324/74 |
| 2016/0043569 | A1 * | 2/2016 | Dally | H01F 27/24 307/104 |

* cited by examiner

*Primary Examiner* — Giovanni Astacio-Oquendo
(74) *Attorney, Agent, or Firm* — Gerhard W. Thielman

(57) ABSTRACT

A passive magnetic flux detector (PMFD) is provided for indicating an ambient magnetic field. The PMFD includes a coil, a rectifier, and an indicator. The indicator is either a light emitting diode (LED), a piezoelectric speaker or both.

6 Claims, 2 Drawing Sheets

PASSIVE MAGNETIC FIELD DETECTOR

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to detection of time varying magnetic fields. In particular, the invention relates to a passive device to detect and warn of the presence of magnetic fields generated from high power radio frequency (RF) systems.

Conventionally, a magnetic flux probe connected to a spectrum analyzer or similar equipment was the only way to detect the presence of a radiating magnetic field from an antenna. However, anyone unfamiliar with the test setup, or which diagnostic equipment to examine, would be unable to tell whether the antenna was radiating. This is a safety concern when the radiated power levels increase to values above safety limits defined by Hazards of Electromagnetic Radiation to Ordnance (HERO), Hazards of Electromagnetic Radiation to Personnel (HERP), and/or Hazards of Electromagnetic Radiation to Fuel (HERF). In addition, the risk of damaging or destroying nearby electronic equipment rises as the radiated power increases due to electromagnetic interference (EMI).

SUMMARY

Conventional magnetic field detectors yield disadvantages addressed by various exemplary embodiments of the present invention. In particular, the embodiments provide a passive magnetic field detector (PMFD) for indicating presence of an ambient magnetic field. The PMFD includes a coil, a rectifier, a light emitting diode, and a piezoelectric speaker.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

Figure 1:
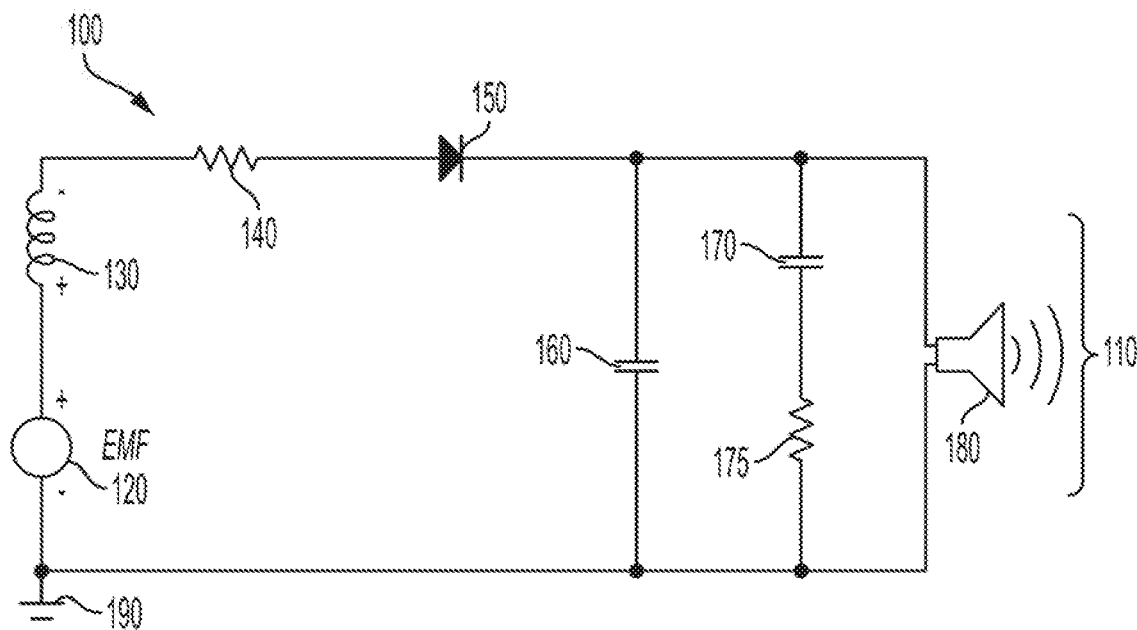
FIG. 1 is an electrical diagram view of an exemplary detector.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, artisans of ordinary skill will readily recognize that devices of a less general purpose nature, such as hardwired devices, e.g., integrated circuits, may also be used without departing from the scope and spirit of the inventive concepts disclosed herewith. General purpose machines include devices that execute instruction code. A hardwired device may constitute an application specific integrated circuit (ASIC), a field programmable gate array (FPGA), digital signal processor (DSP) or other related component.

The disclosure generally employs quantity units with the following abbreviations: length in centimeters (cm), mass in grams (g), time in seconds (s), angles in degrees (°), electric current in amperes (A), potential in volts (V), capacitance in picofarrads (pF) or nanofarrads (nF), inductance in microhenrys (µH), magnetic field strength in microtesla (µT), energy in joules (J) or ergs, and frequencies in kilohertz (kHz) or megahertz (MHz). Supplemental measures can be derived from these, such as density in grams-per-cubic-centimeters (g/cm$^3$), moment of inertia in gram-square-centimeters (kg-m$^2$) and the like.

The objective of the detector is to provide an audio and visual indication of a time varying magnetic field of a defined strength. The induced power from the magnetic field (Faradays Law) is used to power the audio and visual component. An external power source (i.e., batteries) is not required for the exemplary detector.

Exemplary embodiments were developed in response to experimental conditions in which high-powered magnetic fields generated from a spiral antenna coupled into targets of interest. There is no visual or audible indication of the radiated magnetic field from the antenna in response to turning on a high power system. Lack of conventional means to detect magnetic fields becomes a safety concern as the radiated power levels increase. The passive magnetic field detector (PMFD) was developed in order to visually and/or acoustically indicate the radiated magnetic field, in which the intensity of the light or sound rose with increased radiated power.

In the initial configuration, a light emitter provided visual indication, and subsequently, a speaker was incorporated to the PMFD to offer an additional audible signal. The passive nature of the exemplary PMFD constitutes a unique feature compared to other magnetic field detectors. The PMFD does not require a power source due to its receipt of power from the magnetic field being detected. There is also no concern of EMI or other related damages to the PMFD, as would be expected with active magnetic field detectors, due to lack of active components in the PMFD.

FIG. 1 shows an electrical diagram schematic 100 for an exemplary PMFD circuit 110. Resonating at a frequency that depends on inductance and capacitance, the circuit 110 simplifies into an RLC circuit for resistance-inductance-capacitance. Consequently, the rectified DC voltage, which depends on the amplitude of the AC signal, is frequency dependent, meaning the intensity of the light and speaker are also frequency dependent. The electromotive force 120 or EMF (in volts) is also frequency dependent, as shown in the relation:

$$EMF = N \cdot \frac{d\varphi}{dt} = \frac{N \cdot d(\beta_0 \cdot \sin(\omega \cdot t) \cdot \pi \cdot R^2)}{dt} = N \cdot \omega \cdot \beta_0 \cdot \pi \cdot R^2 \cdot \cos(\omega \cdot t), \quad (1)$$

where N is number of winding turns, $\varphi$ is the magnetic field flux, $\beta_0$ is magnitude of the magnetic field, $\omega$ is frequency in radians, t is time (s) and R is the radius of the windings. The EMI 120 equals the rate of change of the flux within the PMFD, multiplied by the number of turns within the PMFD.

The amplitude of the EMF 120 is defined at initial time t as identified by supply voltage $V_0$ in relation:

$$V_0 = EMF_{t=0} = N \cdot 2 \cdot \pi^2 \cdot f \cdot \beta_0 \cdot R^2, \quad (2)$$

where f is the frequency in Hz. The inductance of the PMFD $L_1$ is determined with the following relation:

$$L_1 = \mu_0 \cdot N^2 \cdot \pi \cdot R, \quad (3)$$

where $\mu_0$ is permeability of free space at $0.4\pi$ µH/m. The inductor 130 as constructed has a radius R of 5.1 cm, and eleven turns N, which equates to an inductance of 24 µH. This is in good agreement with the measured inductance of 23 µH.

Figure 2:
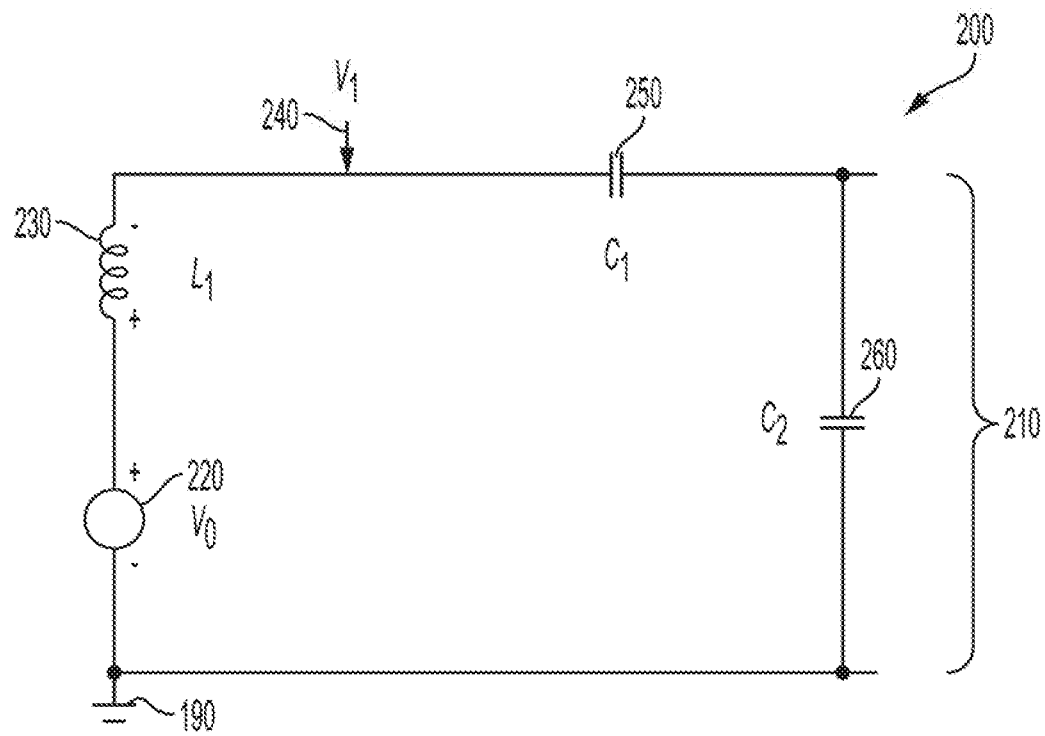
FIG. 2 is a simplified electrical diagram view of the detector.

FIG. 2 shows a simplified electrical schematic 200 for an exemplary PMFD diagram 210. The frequency response of the circuit 110 due to its lumped inductive and capacitive elements can be determined by simplifying the electrical schematic from the circuit 110 to a simplified circuit 210. The supply voltage $V_0$ 220 represents the EMF voltage connecting its anode to the PMFD's inductor at the positive terminal with inductance $L_1$ 230, which connects to diode potential $V_1$ 240 followed by a junction with capacitance $C_1$ 250, while its negative terminal taps to a rectifying capacitance $C_2$ 260. The rectifying diode 150 can be represented by its junction capacitance $C_1$ 250, The diode 150 incorporated in the PMFD is a 1N270 germanium diode, which has a depletion capacitance of 0.8 pF. A low depletion capacitance is required to rectify high-frequency signals.

A rectifying capacitance $C_2$ 260 can be on the order of 10 nF, and connects in parallel with a light emitting diode (LED). The LED has a capacitance on the order of 50 pF, which can be neglected being in parallel with the much larger rectifying capacitance. The diode capacitance $C_1$ 250 in series with the rectifying capacitance $C_2$ 260 has a total capacitance $C_1$ equal to the parallel capacitance relation:

$$C_1 = \frac{C_1 \cdot C_2}{C_1 + C_2} \cong C_1. \quad (4)$$

The rectifying capacitance $C_2$ 260 can be several orders of magnitude greater than the diode capacitance, thus the total capacitance of the circuit can be represented by $C_1$ 250.

Consequently, the resonant frequency of the circuit 210 depends only on the inductance $L_1$ 230 of the PMFD, and the junction capacitance of the rectifying diode 150. The rectifying capacitance $C_2$ 260 incorporated in the PMFD circuit 110 is 100 nF. The frequency response of the circuit 210, with respect to the diode potential $V_1$ 240 can be written as follows:

$$V_1 = V_0 \cdot \left| \frac{1}{1 - s^2 \cdot L_1 \cdot C_1} \right|, \quad (5)$$

where s is the complex frequency.

Substituting eqn. (2) into eqn. (5) provides the frequency response of the PMFD with respect to a time-varying magnetic field in relation:

$$V_1 = N \cdot B_0 \cdot \pi \cdot R^2 \cdot \left| \frac{s}{1 - s^2 \cdot L_1 \cdot C_1} \right|, \quad (6)$$

where $B_0$ is peak amplitude of the varying magnetic field. The diode potential $V_1$ in eqn. (6) can be considered the rectified voltage of the PMFD as t approaches infinity. The rectified voltage from eqn. (6) is depicted in graphical form in view 300 with a constant magnetic field amplitude of 1 µT.

Figure 3:
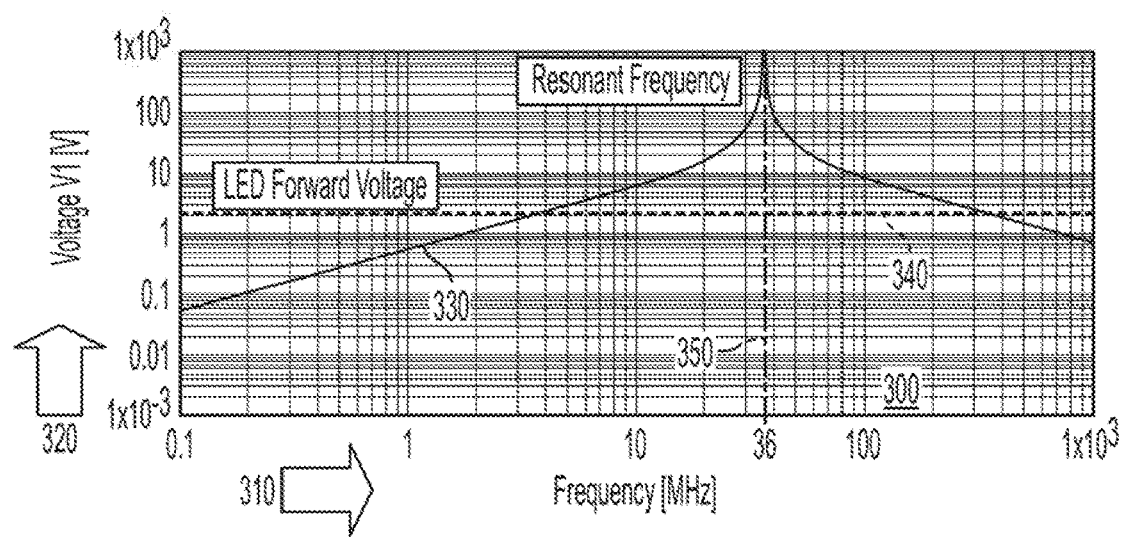
FIG. 3 is a graphical view of a voltage response to frequency.

FIG. 3 shows a graphical view 300 voltage over a frequency range, Frequency 310 (MHz) denotes the abscissa, while diode voltage potential 320 (V) denotes the ordinate. A cusp curve 330 denotes potential $V_1$, while the dashed horizontal line 340 at 2 V indicates LED forward voltage. The plot 300 illustrates the frequency response 330 of the rectified voltage with a constant magnetic field amplitude of 1 µT. The PMFD's sensitivity increases with frequency until reaching the resonant frequency, beyond which point the sensitivity of the PMFD decreases as the frequency continues to increase. The operating range of the PMFD occurs whenever the diode voltage $V_1$ 330 is above the forward voltage 340 of the LED, e.g. 4 MHz to 300 MHz for this example.

Figure 4:
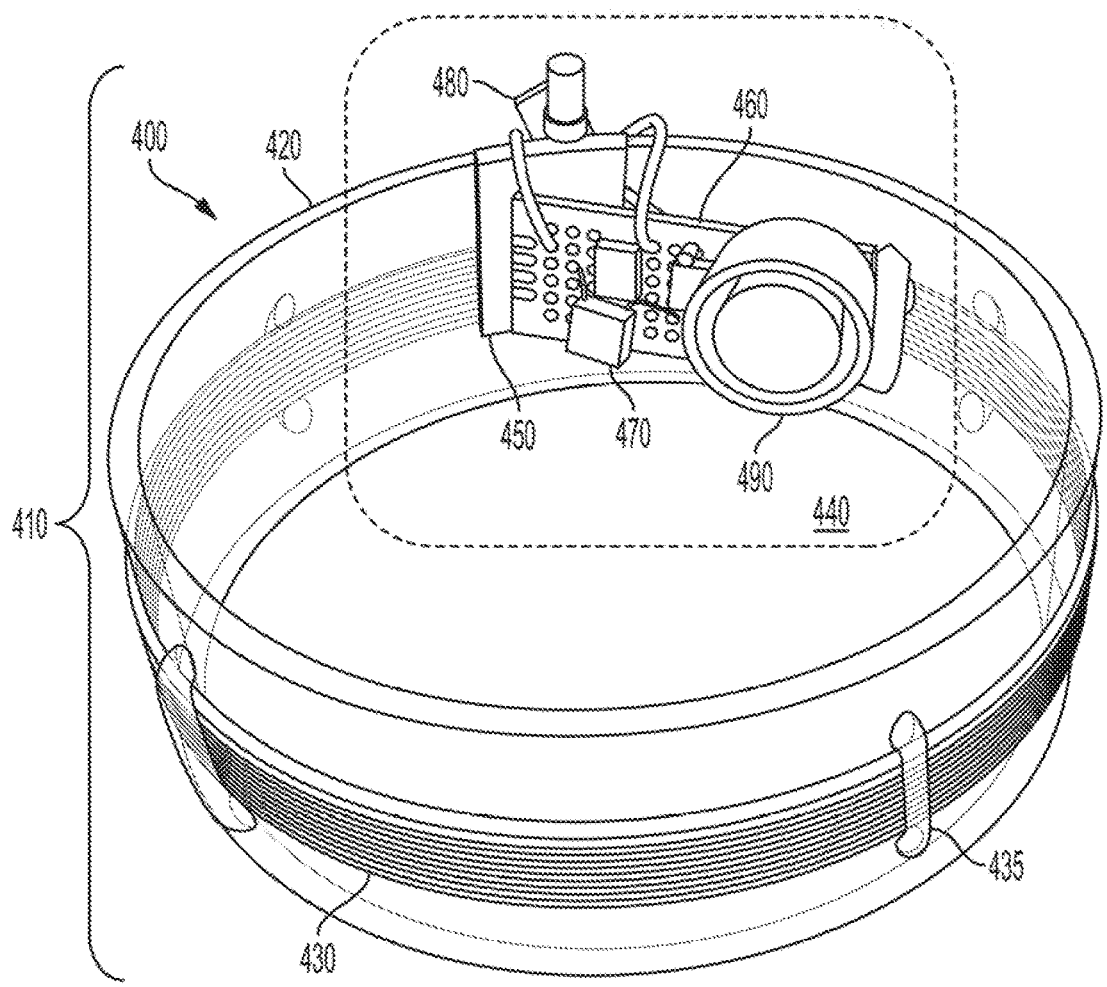
FIG. 4 is an isometric view of an exemplary constructed detector.

FIG. 4 shows a perspective view 400 of an exemplary constructed PMFD representation 410 corresponding to the electrical schematic 110. A cylindrical acrylic housing 420 provides a structure around which a wire coil 430 wraps around, held in position by brackets 435. A sensor assembly 440 mounted to the housing 420 and connected to the wires of the coil 430 include a mount 450, an integrated circuit (IC) board 460, a capacitor 470, an LED 480 and a Piezo speaker 490 as an acoustic buzzer. The coil 430 is represented by the inductor 130, which creates an electromotive force (EMF) when placed in a time varying magnetic field in accordance with Faraday's Law.

A rectifying circuit, composed of the diode 50 and capacitor 160, convert alternative current (AC) voltage into a direct current (DC) voltage, which is required to power the LED 480. The piezo speaker 490 requires an AC voltage whose frequency matches the frequency of the desired tone, and there exist many DC-AC converting techniques. Many Piezo speakers only require a DC voltage input because the DC-AC circuit is contained within the speaker 490; however, the PMFD 410 incorporates a commonly employed 555 timer in the board 460 to produce the desired frequency for the speaker 490. The 555 timer is powered from the DC voltage provided by the rectifying circuit.

Previous derivations were simplified by assuming linear responses of the components, as well as a uniform magnetic field through the PMFD 410. In reality, there is a non-linear response to the rectifying diode 150 and the LED 480, as well as exposure to a non-uniform magnetic field. The EMF of the PMFD 410 does not reach the kilovolt range, as shown in view 300 at 36 MHz, due to saturation of the non-linear components and the non-uniform nature of the magnetic field. A non-uniform magnetic field will require a higher field strength for detection purposes. However, the analysis as disclosed adequately explains the operating principle of the PMFD 410, and the reasons an external power source is unnecessary. Magnetic fields on the order of 10 µT generate sufficient EMF to power both the LED 480 and the piezo speaker 490.

The exemplary PMFD 410 lacks a quantitative indicator of the field strength, but only an indication that a field exists. However, its simple design, low cost, small size, zero input power requirement, and hardness to EMI can enable its use in a variety of environments to indicate to operators the presence of a time-varying magnetic field. The PMFD 410 was originally built for safety purposes to alert anyone near the antenna of its radiating status. The PMFD 410 was also used to detect strengths and weaknesses in the field around an antenna, as well as radiated fields from other parts of the equipment (e.g., balun transformers, cables). They can be placed virtually anywhere for safety purposes, qualitative measurement purposes, and can even be use to map fields by placing several within a specified area.

The biggest advantage of the PMFD 410 is in not requiring a power source (e.g., DC battery, plug-in AC outlet). Instead, the PMFD 410 indicates the presence of a magnetic field optically and audibly, thus does not require diagnostic cables leading to a data acquisition device. The PMFD 410 can be disposed anywhere in the area of a magnetic field without disrupting the device generating the field. The PMFD design is very simple, inexpensive to construct, and does not require maintenance.

The design of the PMFD 410 can be varied in a number of ways to fit a specific application. For example, the resonant frequency of the PMFD 410 can be tuned to a specified frequency of interest, and the sensitivity can be adjusted so that the PMFD 410 only functions when the field matches the frequency of interest. Most conventional magnetic field detectors, which can be found online, provide a digital reading of the field, along with many other features the PMFD 410 does not have. However, they all require a power source. They are also susceptible to high power RF due to the active components within the PMFD 410.

A more comparable search of this device would be wireless power transfer. U.S. Pat. No. 7,825,543 to Karalis et al. discloses wireless energy transfer disclosed for the purposes of wireless energy transfer. The PMFD 410 exemplary embodiments are distinguishable over Karalis based on sensing magnetic fields opposed to transferring power wirelessly. Although the fundamental physics are both based on Faraday's law, many wireless power systems are designed to maximize coupling efficiency between the power source and the wireless receiver. The PMFD 410 operates over a large frequency range (hundreds megahertz bandwidth), and does not require optimum coupling to the power source to function as designed. Wireless power is still very inefficient and is currently limited to close range applications such as charging of electrical devices (e.g., phones and tablets). The most practical application for this concept is sensing of magnetic fields in high power environments, which is what the PMFD 410 is designed for.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A passive magnetic flux detector (PMFD) for indicating an ambient magnetic field, said PMFD comprising:
   an inductor that receives an induced voltage caused by the magnetic field;
   a rectifying circuit, comprising a diode and a capacitor, that rectifies said induced voltage from said inductor as a rectified voltage, said diode having a diode potential; and
   an alarm indicator that signals in response to said rectified voltage of said rectifying circuit exceeding said diode potential.

2. The PMFD according to claim 1, wherein said ala indicator is a light emitting diode (LED).

3. The PMFD according to claim 1, wherein said alarm indicator is an acoustic speaker.

4. The PMFD according to claim 1, wherein said alarm indicator is a light emitting diode (LED) and an acoustic speaker.

5. The PMFD according to claim 1, wherein said diode has depletion capacitance for rectifying the magnetic field at high frequency.

6. The PMFD according to claim 1, wherein said capacitor has a cape lance of 100 nF.

* * * * *